US008017427B2

(12) United States Patent
Manabe

(10) Patent No.: US 8,017,427 B2
(45) Date of Patent: Sep. 13, 2011

(54) BACKSIDE-ILLUMINATED (BSI) IMAGE SENSOR WITH BACKSIDE DIFFUSION DOPING

(75) Inventor: Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 318 days.

(21) Appl. No.: 12/347,856

(22) Filed: Dec. 31, 2008

(65) Prior Publication Data

US 2010/0164042 A1    Jul. 1, 2010

(51) Int. Cl.
*H01L 21/225* (2006.01)

(52) U.S. Cl. .......... 438/72; 438/459; 438/550; 438/558; 257/E21.151

(58) Field of Classification Search .................. 438/550
See application file for complete search history.

(56) References Cited

U.S. PATENT DOCUMENTS

| | | | | |
|---|---|---|---|---|
| 5,227,313 A * | 7/1993 | Gluck et al. | .................... | 438/66 |
| 7,238,583 B2 * | 7/2007 | Swain et al. | ................... | 438/358 |
| 2004/0195628 A1 * | 10/2004 | Wu et al. | ....................... | 257/351 |
| 2010/0140675 A1 * | 6/2010 | Rhodes | ......................... | 257/292 |

* cited by examiner

*Primary Examiner* — Stephen W Smoot
(74) *Attorney, Agent, or Firm* — Blakely Sokoloff Taylor & Zafman LLP

(57) ABSTRACT

Embodiments of a process comprising forming a pixel on a front side of a substrate, thinning the substrate, depositing a doped silicon layer on a backside of the thinned substrate, and diffusing a dopant from the doped silicon layer into the substrate. Embodiments of an apparatus comprising a pixel formed on a front side of a thinned substrate, a doped silicon layer formed on a backside of the thinned substrate, and a region in the thinned substrate, and near the backside, where a dopant has diffused from the doped silicon layer into the thinned substrate. Other embodiments are disclosed and claimed.

14 Claims, 6 Drawing Sheets

BACKSIDE-ILLUMINATED (BSI) IMAGE SENSOR WITH BACKSIDE DIFFUSION DOPING

TECHNICAL FIELD

The present invention relates generally to image sensors and in particular, but not exclusively, to backside-illuminated image sensors with improved backside doping.

BACKGROUND

Backside-illuminated (BSI) imaging sensors include pixel arrays that are fabricated on the front side of a semiconductor substrate but can nonetheless capture images using light received through the backside of the substrate. During manufacture, the backside of silicon BSI sensors must be thinned by removing material from the backside of the substrate to allow nearby collection photodiodes to generate and collect the related charge. To reduce the color cross talk and improve quantum efficiency (QE) of the pixels in the pixel array, the substrate thickness is often reduced to a few microns.

After substrate thinning, a cleaning step is used to remove particles and other contaminants from the backside. Certain processes are currently used after substrate thinning to improve the sensor performance, such as backside dopant implantation followed by a laser/thermal annealing that is applied to activate the implanted dopants. These processes create several difficulties. Among other things, (1) the implanted dopant can go too deep and harm the short wavelength quantum efficiency (QE) of the pixels, (2) it is difficult to activate all the backside dopant and avoid un-activated defects, and (3) the use of high energy laser annealing can result in defects such as melting the substrate surface. These problems associated with current fabrication processes can cause undesirable problems in the resulting image sensors, such as high dark current and high white pixel count.

BRIEF DESCRIPTION OF THE DRAWINGS

Non-limiting and non-exhaustive embodiments of the present invention are described in this specification with reference to the following figures, wherein like reference numerals refer to like parts throughout the various views unless otherwise specified.

DETAILED DESCRIPTION OF THE ILLUSTRATED EMBODIMENTS

Embodiments of a process, apparatus and system for improved doping of the backside of a backside-illuminated (BSI) imaging sensor are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
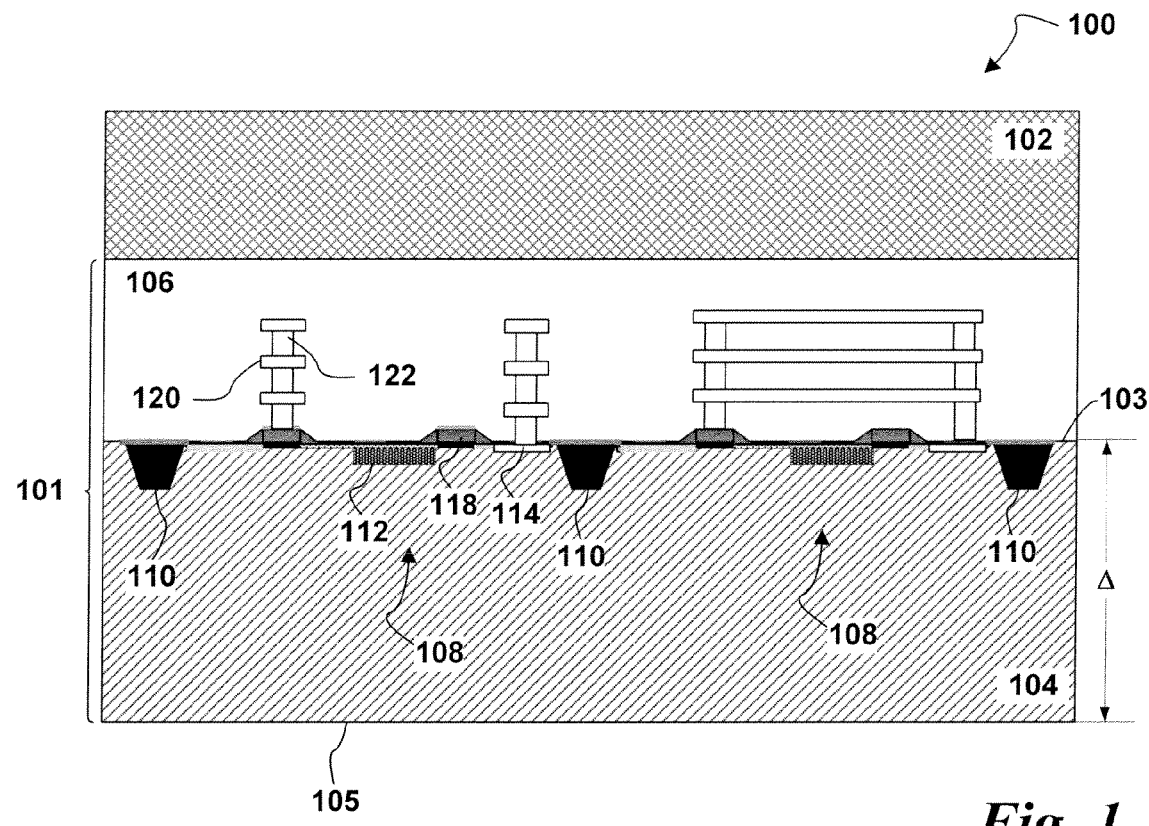
FIG. 1 is a cross-sectional view of an embodiment of a manufacturing assembly used to manufacture an embodiment of a backside-illuminated image sensor.

FIG. 1 illustrates an embodiment of a manufacturing assembly 100 for manufacturing an embodiment of a backside-illuminated image sensor. Manufacturing assembly 100 comprises an image sensor 101 coupled to a carrier wafer 102. In most embodiments, carrier wafer 102 can be removed when manufacturing is complete.

Image sensor 101 includes a substrate 104 having a front side 103, a backside 105, and an initial thickness Δ separating front side 103 from backside 105. Substrate 104 can be a semiconductor material, and in various embodiments can be a p-type semiconductor, an n-type semiconductor, an un-doped (i.e., neither p-type nor n-type) semiconductor, or some combination of the listed semiconductor types. In one particular embodiment, substrate 104 can be a p-type epitaxial silicon substrate. Although not shown in the figure, in some embodiments substrate 104 can include therein circuitry to control image sensor 101 and/or process the signals from the pixels of the image sensor.

A plurality of individual pixels 108 are formed on front side 103 of substrate 104, and each individual pixel 108 is separated and electrically isolated from adjacent pixels by shallow trench isolations (STIs) 110. The term pixel as used herein is meant to encompass all pixel designs, including CMOS pixels, CCD pixels, etc. Although only two pixels 108 are illustrated in the figure, embodiments of image sensor 101 can of course include many more pixels, usually arranged into a pixel array that can be used for image capture. In one embodiment, pixels 108 are active pixels that use four transistors (known as 4T active pixels), but in other embodiments pixels 108 can include more or less transistors, and in still other embodiments each pixel 108 need not use the same number of transistors as other pixels within the same array. Each pixel 108 is formed in front side 103 of substrate 104 and includes a photodiode 112, a floating node 114, and transfer gate 118 that transfers charge accumulated in photodiode 112 to floating node 114. Although described as a photodiode for the illustrated embodiment, in other embodiments photodiode 112 can be any kind of photodetector element, such as any type of photogate or photocapacitor.

In operation of each pixel 108, during an integration period (also referred to as an exposure period or accumulation period) photodiode 112 receives incident light from one or both of front side 103 and backside 105 and generates a corresponding electrical charge that is held in the photodiode. At the end of the integration period, charge held in the photodiode is transferred into floating node 114 by applying a voltage pulse to transfer gate 118. When the signal has been transferred to floating node 114, transfer gate 118 is turned off again for the start of another integration period of photodiode 112. After the signal has been transferred from photodiode 112 to floating node 114, the signal held in floating node 114 is used to modulate an amplification transistor (not shown), and an address transistor (also not shown) is used to address the pixel and to selectively read out the signal onto the signal line. After readout through the signal line, a reset transistor (also not shown) resets floating node 114 to a reference voltage, which in one embodiment is $V_{dd}$.

After formation of pixels 108 in substrate 104, a dielectric layer 106 is mounted onto front side 103 of substrate 104. Dielectric layer 106 has formed therein various layers of conductive traces 120, as well as vias 122 that electrically couple the different layers of conductive traces. Traces 120 and vias 122 together provide the electrical interconnections that allow signals to be sent to and retrieved from each pixel 108 in image sensor 101.

Carrier wafer 102 is attached to the side of dielectric layer 106 opposite the side where the dielectric layer is coupled to substrate 104. Among other things, carrier wafer 102 provides physical support for dielectric layer 106 and substrate 104 so that these two layers are not damaged by forces applied to manufacturing assembly 100 during the different manufacturing steps. In different embodiments, carrier wafer 102 can be made up of various materials such as silicon. In an embodiment where image sensor 101 is to be used exclusively with backside illumination, carrier wafer 102 can be left attached to the other layers if necessary, but in embodiments where image sensor 101 will be used with both front side and backside illumination carrier wafer 102 can be removed after manufacture of image sensor 101 is complete.

Figure 2:
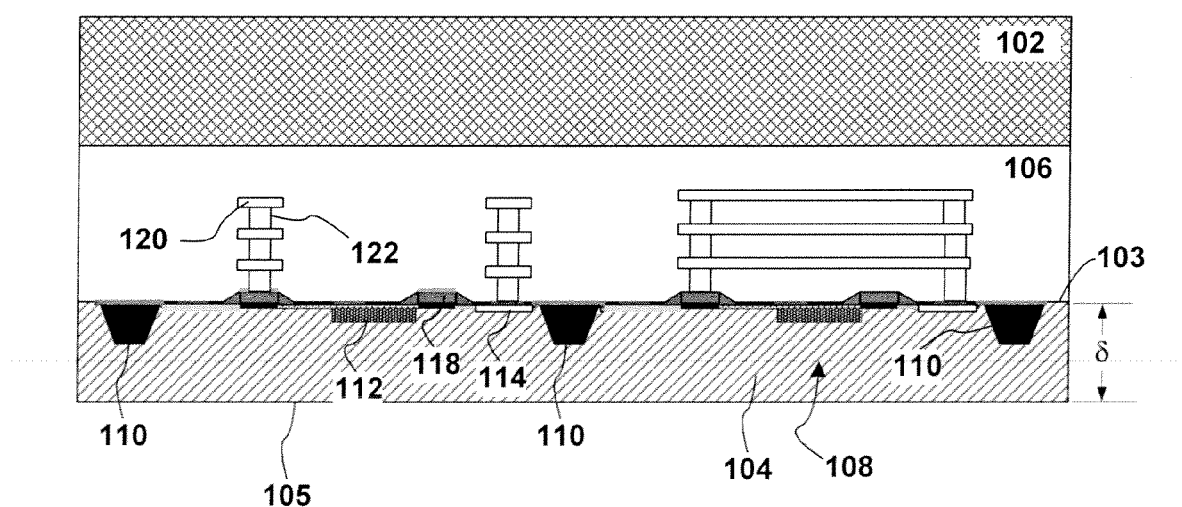
FIG. 2 is a cross-sectional view of the embodiment of the manufacturing assembly shown in FIG. 1 after thinning the substrate by removing material from a backside of the substrate.

FIG. 2 illustrates a subsequent state of manufacturing assembly 100. Starting with the manufacturing assembly shown in FIG. 1, the initial thickness Δ of substrate 104 is reduced to a smaller thickness δ by removing material from backside 105. Thinning substrate 104 from its initial thickness Δ to a smaller thickness δ allows for more efficient backside illumination of pixels 108. Reducing the thickness of substrate 104 can be accomplished differently in different embodiments. In one embodiment, substrate 104 can be thinned by removing material from backside 105 using mechanical techniques such as grinding or chemical mechanical polishing (CMP), but in other embodiments material can be removed by other techniques such as wet or dry chemical etching. In still other embodiments, material can be removed from the backside using a combination of mechanical and chemical techniques or a combination of different chemical techniques.

Figure 3:
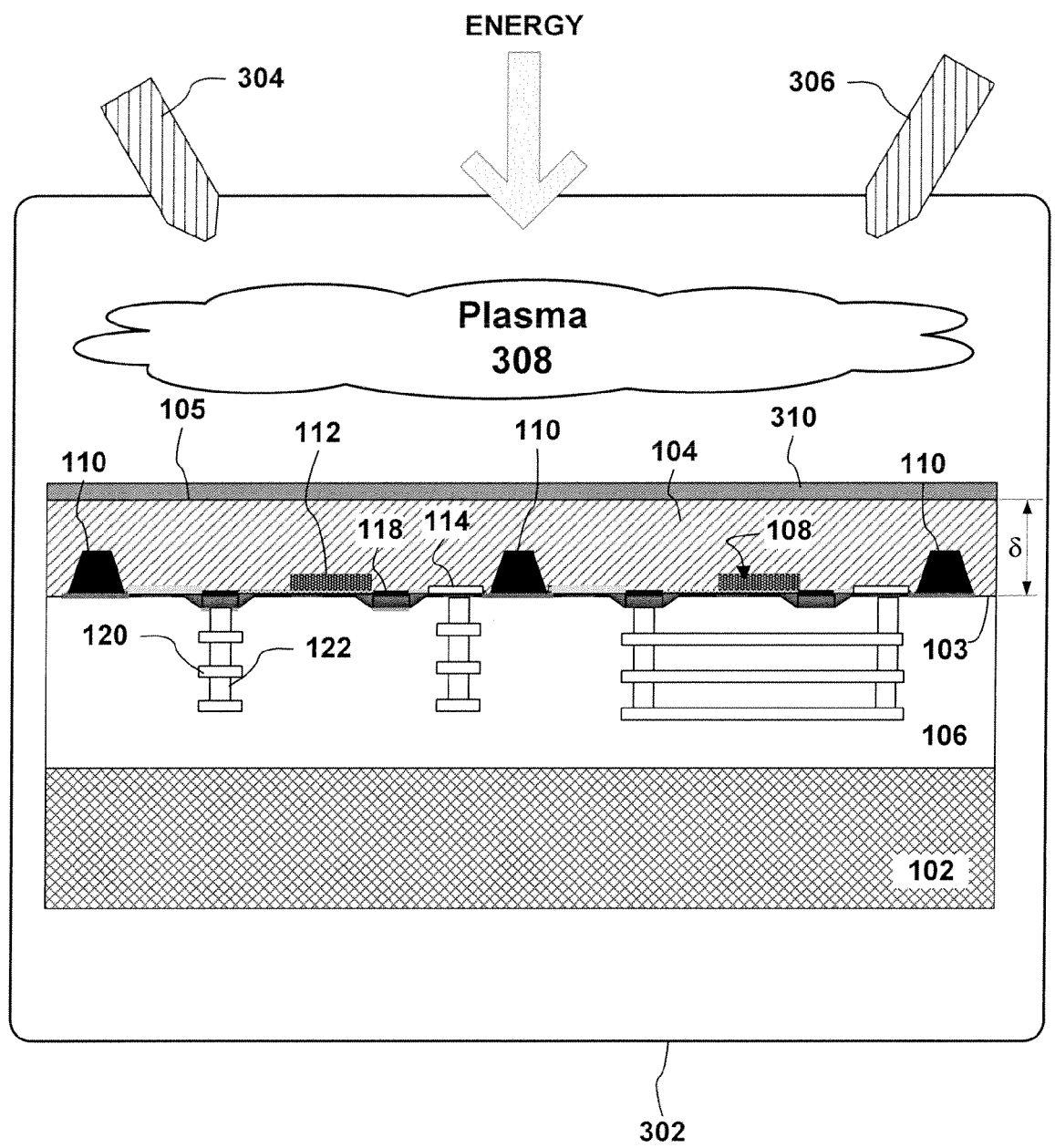
FIG. 3 is a cross-sectional view of the manufacturing assembly embodiment shown in FIG. 2 during plasma deposition of a doped silicon layer on the backside of the thinned substrate.

FIG. 3 illustrates a subsequent state of manufacturing assembly 100 in which a doped silicon layer 310 is deposited on backside 105 using plasma-enhanced chemical vapor deposition (PECVD). Because plasma deposition is performed at a relatively low temperature—plasma treatments can have temperatures as low as 100° C. that will not damage metal structures—it is suitable for deposition on the backside 105. Of course, as further discussed below, in other embodiments other deposition processes can be used to deposit doped silicon layer 310.

After thinning substrate 104 as shown in FIG. 2, manufacturing assembly 100 is first placed in a chamber 302, which includes a first inlet 304 through which a silicon source is injected into the chamber and a second inlet 306 through which a dopant source is injected into the chamber. In one embodiment, the relative proportions of the silicon source and the dopant source can be adjusted so provide a stoichiometric amount of the dopant, but in other embodiments the relative proportions of the silicon and dopant sources can be adjusted to non-stoichiometric amounts as needed.

In one embodiment, the silicon source injected into the chamber through inlet 304 can be a gas such as silane (nominally $SiH_4$) and the dopant source injected into chamber 302 through inlet 306 can be a p-type dopant gas such as Diborane (nominally $B_2H_6$) or Boron trichloride (nominally $BCl_3$). In other embodiments other gaseous or non-gaseous silicon and dopant sources used can be used. For example, in one embodiment phosphorus and/or indium can be used as dopants, but of course in other embodiments other dopants or combinations of dopants can be used; the exact dopant or dopant combination used will depend mostly on the desired pixel performance characteristics.

In the illustrated embodiment, plasma 308 is generated on-site (i.e., within chamber 302) from the silicon source and the dopant source. The silicon source and dopant source are flowed into chamber 302, where they mix. Conditions inside the chamber, such as the temperature and pressure inside the chamber and the energy that is applied to the gas, are adjusted to create plasma 308 from the mixture. In an embodiment in which the silicon and dopant sources are gaseous, the selected sources are flowed into chamber 302. In different embodiments, the gas flow rate of the sources can be between about 10 standard cubic centimeters per minute (SCCM) and about 10,000 SCCM, while the chamber pressure ranges between about 0.1 mTorr and about 100 Torr, and the temperature ranges between about 100° C. and about 400° C.

The energy used to create plasma 308 can, for example, be radio frequency (RF) energy or direct current (DC) energy. In an embodiment using RF to create plasma 308, an RF power between about 10 and about 1000 W can be applied to the gas mixture. Although the illustrated embodiment shows on-site generation of plasma, in other embodiments plasma 308 can be generated outside chamber 302 and then injected into the chamber.

As plasma 308 is formed in chamber 302, the silicon source and the dopant source chemically react. Plasma 308 then cools and condenses onto backside 105. Over time, the cumulative condensation of plasma 308 leaves a doped silicon layer 310 on the backside. When doped silicon layer 310 has the desired thickness, the plasma process can be stopped. In one embodiment, doped silicon layer 310 has a thickness between about 100 Angstroms and 900 Angstroms, but of course in other embodiments doped silicon layer 310 can have a thickness outside this range. In still another embodiment, doped silicon layer 310 can be deposited at a selected thickness and then thinned after deposition by various means, such as grinding, chemical-mechanical polishing, or wet or dry chemical etching. In an embodiment using silane as the silicon source and Diborane (nominally $B_2H_6$) or Boron trichloride (nominally $BCl_3$) as a dopant source, doped silicon layer 310 can be Borosilicate Glass (BSG), but in other embodiments doped silicon layer 310 can be something else, depending on the selected silicon source and dopant source.

Although the illustrated embodiment uses plasma deposition to deposit doped silicon layer 310, in other embodiments other methods can be used to deposit the doped silicon layer, so long as the chosen deposition method does not require temperatures that would ruin interconnects 120 and vias 122 or cause other temperature-related problems. For example, in an embodiment where interconnects 120 and vias 122 are made of aluminum the temperature must remain below 450° C., both to avoid melting and/or evaporating the vias and interconnects and to prevent small bubbles created during the bonding process for carrier wafer 102 from getting larger and pushing apart the seam between the carrier wafer and dielectric layer 106. Examples of other processes that can be used to deposit doped silicon layer 310 include using spin on glass (SOG), in which liquefied doped silicon glass is deposited on the backside, the substrate is spun to distribute the doped silicon glass, and solvent is baked out of the doped silicon glass after spin on coating.

Figure 4A:
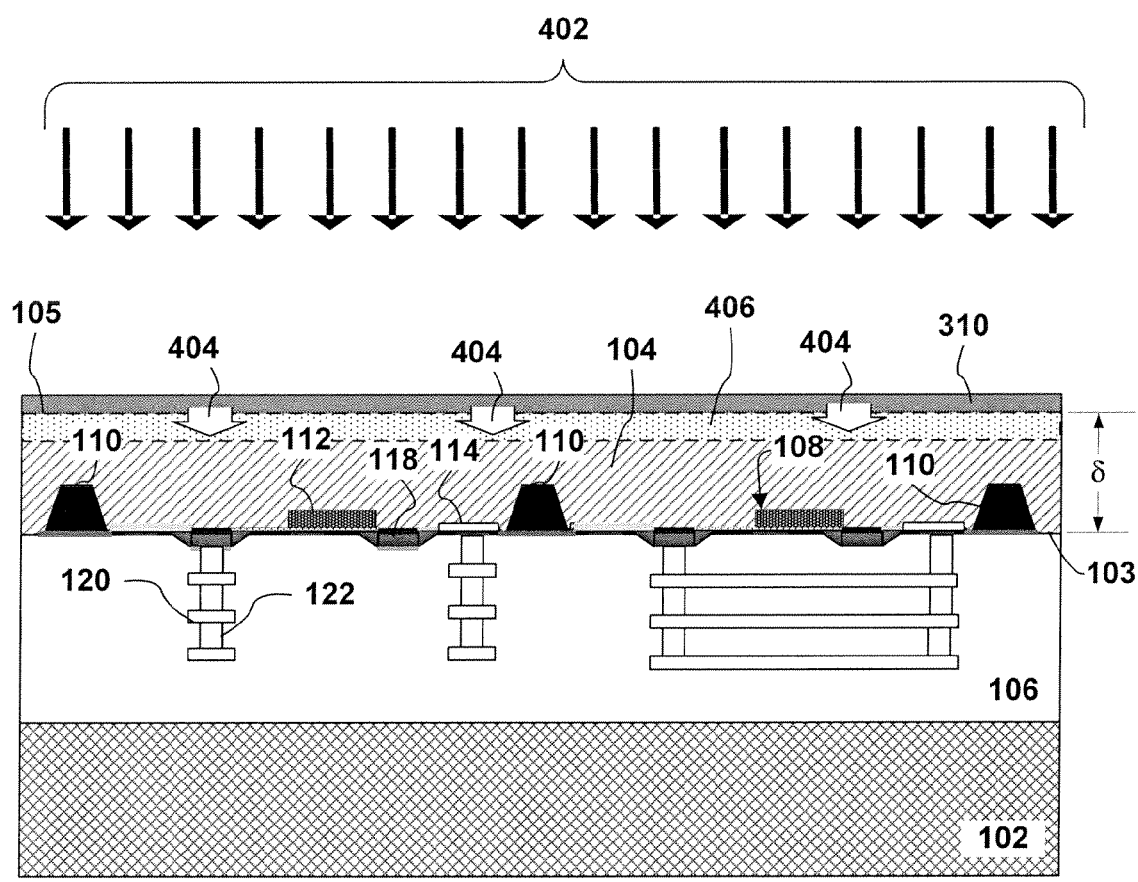
FIG. 4A is a cross-sectional view of an embodiment the manufacturing assembly embodiment shown in FIG. 3 during laser annealing of the doped silicon layer on the backside of the substrate.
Figure 4B:
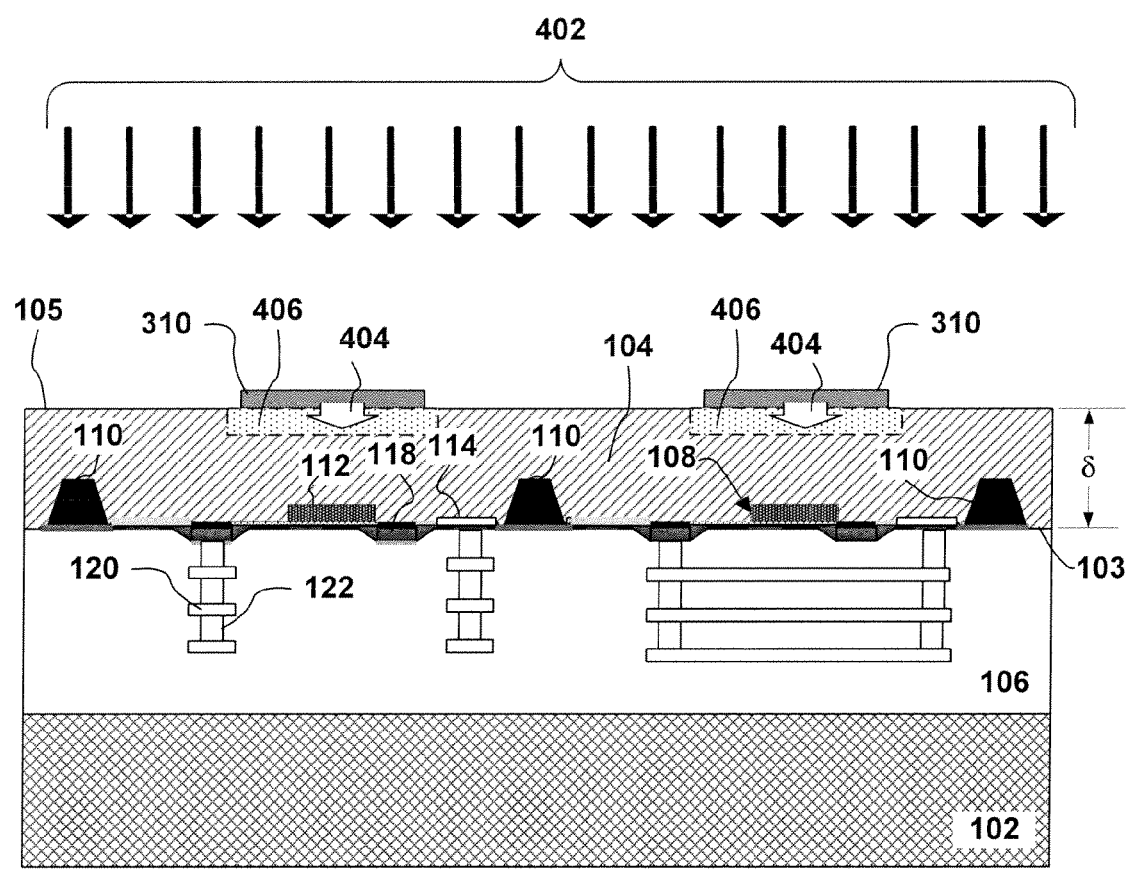
FIG. 4B is a cross-sectional view of an alternative embodiment of the manufacturing assembly embodiment shown in FIG. 4A during laser annealing of the doped silicon layer on the backside of the substrate.

FIGS. 4A-4B illustrate different embodiments of a subsequent state of manufacturing assembly 100. In FIG. 4A, following deposition of doped silicon layer 310 as shown in FIG. 3, laser radiation 402 is directed onto doped silicon layer 310 to laser anneal the doped silicon. In one embodiment, laser radiation 402 is of a short wavelength, such as a blue wavelength, that is absorbed better at or near the surface—that is, absorbed mostly by doped silicon layer 310—and does not penetrate through substrate 104. Longer-wavelength laser radiation, such as a red laser, can be used but is more difficult because it could penetrate through substrate 104 to dielectric layer 106, possibly causing traces 120 and vias 122 to melt or deform. The laser annealing applied to doped silicon layer 310 causes dopant molecules within the doped silicon layer to diffuse across the interface between doped silicon layer 310 and backside 105 and into substrate 104; this solid-state diffusion of dopants is illustrated by arrows 404. As a result of the solid-state diffusion caused by laser annealing, a doped region 406 is created within substrate 104. Doped region 406 and extends from at or near backside 105 into substrate 104. The extent to which doped region extends into substrate 104 can depend on process variables such as the laser energy and annealing time.

FIG. 4B illustrates an alternative embodiment of the manufacturing assembly 100 during laser annealing. This alternative embodiment shares many features with the embodiment shown in FIG. 4A. The primary difference between the embodiments of FIGS. 4A and 4B is the placement of doped silicon layer 310. In FIG. 4A, the doped silicon layer extends over substantially the entire backside 105. By contrast, in FIG. 4B, doped silicon layer 310 has been patterned and etched so that it covers only selected locations on backside 105. As a result of patterning and etching the doped silicon layer, doped regions 406 within substrate 104 also appear only at selected regions within substrate 104.

Figure 5A:
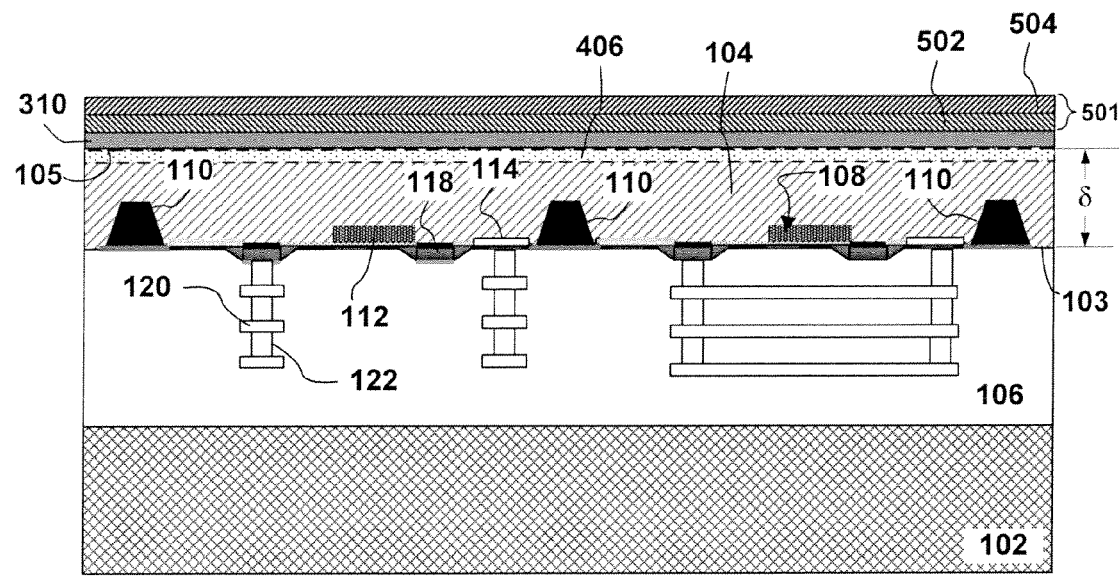
FIG. 5A is a cross-sectional view of the manufacturing assembly embodiment shown in FIG. 4A after an anti-reflective coating has been applied over the doped silicon layer.
Figure 5B:
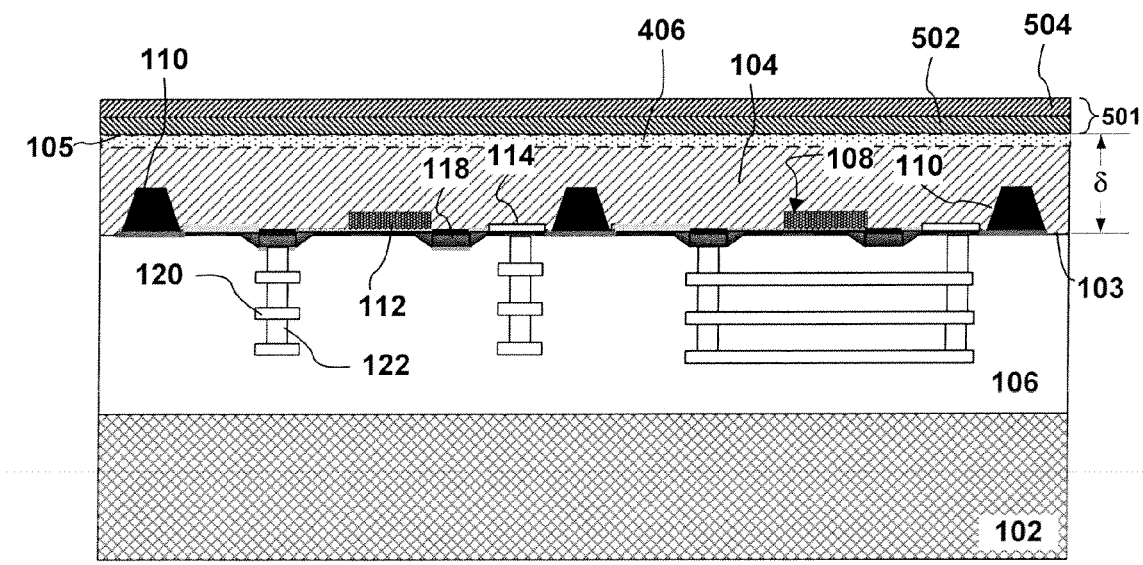
FIG. 5B is cross-sectional view of an alternative embodiment of FIG. 5A in which the doped silicon layer is removed before applying an anti-reflective coating over the backside of the substrate.

FIGS. 5A-5B illustrate different embodiments of a subsequent state of manufacturing assembly 100. FIG. 5A illustrates an embodiment in which, starting with the manufacturing assembly as shown in FIG. 4A, an anti-reflective coating (ARC) layer 501 is deposited on doped silicon layer 310. Typically ARC layer 501 includes a pair of layers 502 and 504 with mismatched indices of refraction so that the ARC layer can prevent reflection of light incident on the back of assembly 100. In one embodiment, the pair of layers is made up of a pair of optically transparent insulators: layer 502 can be silicon oxide (nominally $SiO_2$) and layer 504 silicon nitride (nominally $Si_3N_4$), or vice versa. In other embodiments one of the pair of layers 502 and 504 that make up ARC layer 501 can be a transparent conductor such as Indium Tin Oxide (ITO), so that ARC layer 501 can function as an electrical path in addition to its anti-reflective function.

FIG. 5B illustrates an alternative embodiment that is similar to the embodiment of FIG. 5A, the primary difference being that doped silicon layer 310 is removed and ARC 501 is instead deposited on backside 105. In both embodiments of FIGS. 5A-5B, additional layers can also be added over ARC layer 501 for different purposes, and in either embodiment ARC layer 501 can be deposited using a plasma-enhanced chemical vapor deposition (PECVD) or other deposition techniques.

Figure 6:
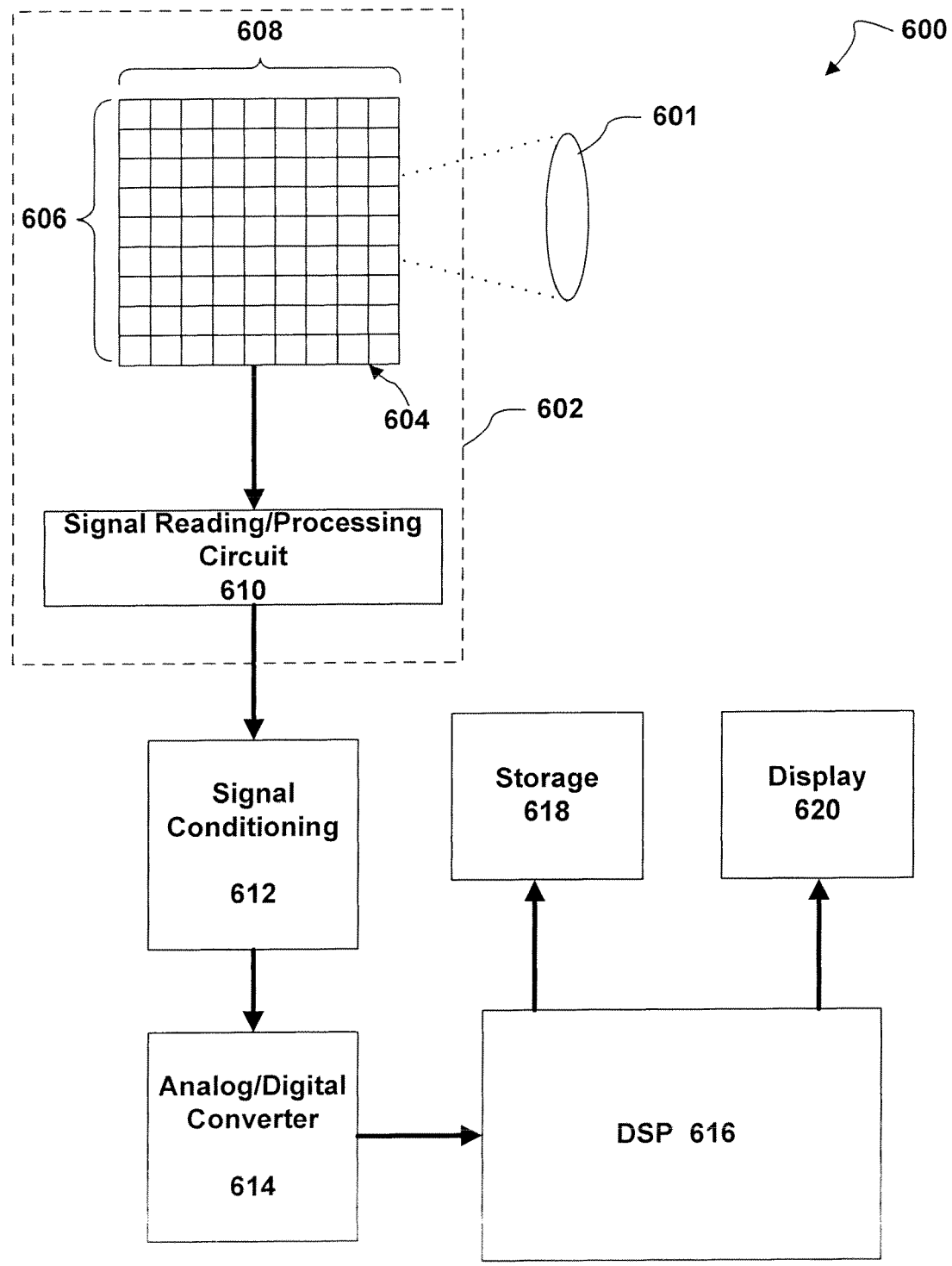
FIG. 6 is a block diagram of an embodiment of an imaging system that can employ an embodiment of the backside-illuminated image sensor whose manufacture is shown in FIGS. 1-5B.

FIG. 6 illustrates an embodiment of an imaging system 600. Optics 601, which can include refractive, diffractive or reflective optics or combinations of these, are coupled to image sensor 602 to focus an image onto the pixels in pixel array 604 of the image sensor. Pixel array 604 captures the image and the remainder of imaging system 600 processes the pixel data from the image.

Image sensor 602 comprises a pixel array 604 and a signal reading and processing circuit 610. In one embodiment, image sensor 602 is a backside-illuminated image sensor including a pixel array 604 that is two-dimensional and includes a plurality of pixels arranged in rows 606 and columns 608. One or more of the pixels in pixel array 604 can be a pixel manufactured as shown in FIGS. 1 through 5B. During operation of pixel array 604 to capture an image, each pixel in pixel array 604 captures incident light (i.e., photons) during a certain exposure period and converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

Illustrated pixel array 604 is regularly shaped, but in other embodiments the array can have a regular or irregular arrangement different than shown and can include more or less pixels, rows, and columns than shown. Moreover, in different embodiments pixel array 604 can be a color image sensor including red, green, and blue pixels designed to capture images in the visible portion of the spectrum, or can be a black-and-white image sensor and/or an image sensor designed to capture images in the invisible portion of the spectrum, such as infra-red or ultraviolet.

Image sensor 602 includes signal reading and processing circuit 610. Among other things, circuit 610 can include circuitry and logic that methodically reads analog signals from each pixel, filters these signals, corrects for defective pixels, and so forth. In an embodiment where circuit 610 performs only some reading and processing functions, the remainder of the functions can be performed by one or more other components such as signal conditioner 612 or DSP 616. Although shown in the drawing as an element separate from pixel array 604, in some embodiments reading and processing circuit 610 can be integrated with pixel array 604 on the same substrate or can comprise circuitry and logic embedded within the pixel array. In other embodiments, however, reading and processing circuit 610 can be an element external to pixel array 604 as shown in the drawing. In still other embodiments, reading and processing circuit 610 can be an element not only external to pixel array 604, but also external to image sensor 602.

Signal conditioner 612 is coupled to image sensor 602 to receive and condition analog signals from pixel array 604 and reading and processing circuit 610. In different embodiments, signal conditioner 612 can include various components for conditioning analog signals. Examples of components that can be found in signal conditioner include filters, amplifiers, offset circuits, automatic gain control, etc. In an embodiment where signal conditioner 612 includes only some of these elements and performs only some conditioning functions, the remaining functions can be performed by one or more other components such as circuit 610 or DSP 616. Analog-to-digital converter (ADC) 614 is coupled to signal conditioner 612 to receive conditioned analog signals corresponding to each pixel in pixel array 604 from signal conditioner 612 and convert these analog signals into digital values.

Digital signal processor (DSP) 616 is coupled to analog-to-digital converter 614 to receive digitized pixel data from ADC 614 and process the digital data to produce a final digital image. DSP 616 can include a processor and an internal memory in which it can store and retrieve data. After the image is processed by DSP 616, it can be output to one or both of a storage unit 618 such as a flash memory or an optical or magnetic storage unit and a display unit 620 such as an LCD screen.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A process comprising:
   forming a pixel on a front side of a substrate;
   thinning the substrate;
   depositing a doped silicon layer on a backside of the thinned substrate; and
   diffusing a dopant from the doped silicon layer into the substrate.

2. The process of claim 1 wherein the substrate includes a p-type epitaxial layer on a p+ doped substrate.

3. The process of claim 1 wherein depositing a doped silicon layer comprises depositing the doped silicon layer using plasma-enhanced chemical vapor deposition (PECVD).

4. The process of claim 1 wherein the doped silicon layer is doped with a p-type dopant.

5. The process of claim 4 wherein the p-type dopant is boron or indium.

6. The process of claim 1, further comprising removing the doped silicon layer from the backside of the substrate.

7. The process of claim 6, further comprising depositing an anti-reflective coating on the backside of the substrate.

8. A process comprising:
   forming a pixel on a front side of a substrate;
   thinning the substrate;
   depositing a doped silicon layer on a backside of the thinned substrate; and
   diffusing a dopant from the doped silicon layer into the substrate, wherein diffusing a dopant from the doped silicon layer comprises laser annealing the doped silicon layer.

9. The process of claim 8 wherein laser annealing comprises laser annealing at or near a blue wavelength.

10. The process of claim 8 wherein laser annealing comprises low-energy laser annealing.

11. A process comprising:
    forming a pixel on a front side of a substrate;
    thinning the substrate;
    depositing a doped silicon layer on a backside of the thinned substrate;
    diffusing a dopant from the doped silicon layer into the substrate; and
    thinning the doped silicon layer.

12. A process comprising:
    forming a pixel on a front side of a substrate;
    thinning the substrate;
    depositing a doped silicon layer on a backside of the thinned substrate;
    diffusing a dopant from the doped silicon layer into the substrate; and
    depositing an anti-reflective coating on the doped silicon layer.

13. The process of claim 12 wherein the anti-reflective coating comprises a transparent conducting layer and an insulating layer, the transparent conducting layer sandwiched between the doped silicon layer and the insulating layer.

14. The process of claim 12 wherein the anti-reflective coating comprises a pair of insulating layers having different indices of refraction.

* * * * *